US009117821B2

(12) United States Patent
Barmak Vaziri et al.

(10) Patent No.: US 9,117,821 B2
(45) Date of Patent: Aug. 25, 2015

(54) ORIENTED CRYSTAL NANOWIRE INTERCONNECTS

(71) Applicant: CARNEGIE MELLON UNIVERSITY, Pittsburgh, PA (US)

(72) Inventors: Katayun Barmak Vaziri, White Plains, NY (US); Kevin Coffey, Oviedo, FL (US); Dooho Choi, Goyang (KR)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 14/204,050

(22) Filed: Mar. 11, 2014

(65) Prior Publication Data
US 2014/0264887 A1  Sep. 18, 2014

Related U.S. Application Data

(60) Provisional application No. 61/851,695, filed on Mar. 12, 2013.

(51) Int. Cl.
*H01L 23/48* (2006.01)
*H01L 23/52* (2006.01)
*H01L 29/40* (2006.01)
*H01L 23/532* (2006.01)

(52) U.S. Cl.
CPC .... H01L 23/53209 (2013.01); H01L 23/53257 (2013.01); *H01L 2924/0002* (2013.01)

(58) Field of Classification Search
CPC ............... H01L 23/53209; H01L 23/53257; H01L 2924/0002
See application file for complete search history.

(56) References Cited

U.S. PATENT DOCUMENTS

| 3,331,124 | A  | * | 7/1967  | Hall ............................ 438/50 |
| 3,968,466 | A  | * | 7/1976  | Nakamura et al. ............. 338/42 |
| 7,585,380 | B2 | * | 9/2009  | Michaluk et al. ............. 148/422 |
| 2003/0217603 | A1 | * | 11/2003 | Ishio ............................ 73/754 |
| 2006/0075626 | A1 | * | 4/2006 | Hwang et al. .............. 29/592.1 |
| 2006/0076866 | A1 | * | 4/2006 | Terui et al. .................... 313/309 |
| 2007/0051900 | A1 | * | 3/2007 | Ward ........................ 250/423 R |
| 2007/0105356 | A1 | * | 5/2007 | Wu et al. ..................... 438/584 |
| 2007/0201615 | A1 | * | 8/2007 | Zienert et al. ................ 378/73 |
| 2014/0264887 | A1 | * | 9/2014 | Barmak Vaziri et al. ..... 257/770 |

OTHER PUBLICATIONS

Choi, D. et al. "Crystallographic anisotropy of the resistivity size effect in single crystal tungsten nanowires". Sci. Rep. 3, 2591; DOI:10.1038/srep02591 (2013).

* cited by examiner

*Primary Examiner* — Jarrett Stark
(74) *Attorney, Agent, or Firm* — Fish & Richardson P.C.

(57) ABSTRACT

Interconnects for semiconductors formed of materials that exhibit crystallographic anisotropy of the resistivity size effect such that line resistivity in one crystallographic orientation becomes lower than the resistivity in the other directions and methods of fabrication and use thereof are described. A wire having a dimension that results in an increase in the electrical resistivity of the wire can be formed of a material with a conductive anisotropy due to crystallographic orientation relative to the direction of current flow that minimizes the increase in the electrical resistivity as compared to the other orientations at that dimension.

22 Claims, 3 Drawing Sheets

ORIENTED CRYSTAL NANOWIRE INTERCONNECTS

CROSS-REFERENCE TO RELATED APPLICATION

This application claims the benefit of Provisional Patent Application Ser. No. 61/851,695, filed Mar. 12, 2013, which is hereby incorporated by reference in its entirety.

FIELD OF THE INVENTION

This invention relates to nanoscale wires in electronic devices and specifically to interconnects for semiconductors devices. More particularly, this invention relates to the fabrication and use of oriented-crystal nanowire interconnects for semiconductors.

BACKGROUND OF THE INVENTION

The resistivity size effect refers to the phenomenon by which there is an increase in electrical resistivity with decreasing conductor dimension(s). The resistivity size effect in metals was first observed in 1901, and the basic physics was understood by the mid-twentieth century. However, the phenomenon has seen a recent resurgence of interest as a result of the severe resistivity increase observed in the nanoscale copper (Cu) wires that serve as interconnects in semiconductor device technology.

The resistivity size effect is typically attributed to the momentum loss of carriers along the axis of the conductors due to surface scattering (evidenced by the film-thickness/line-width dependence of resistivity) and grain boundary scattering (evidenced by the grain size dependence of resistivity). The two most widely used physical models for these scattering mechanisms are the Fuchs-Sondheimer (FS) surface scattering model, incorporating a specularity parameter, p, in the range of 0-1 for diffuse vs. specular scattering from surfaces, and the Mayadas-Shatzkes (MS) grain boundary scattering model, incorporating a reflection coefficient, R, in the range of 0-1 for scattering from grain boundaries.

SUMMARY OF THE INVENTION

This disclosure describes methods for the fabrication and use of oriented-crystal nanowires for electronic devices in which the crystals are oriented to exhibit anisotropic scattering processes whereby line resistivity in one crystallographic orientation becomes lower than the resistivity in other orientations.

A reduction in the size effect severity in wires of width and height sufficiently small so as to result in an increase in the electrical resistivity of the wire can be achieved by considering the anisotropy of conduction in the material forming the wire. The anisotropy of conduction gives rise to the anisotropic scattering processes such that line resistivity in one crystallographic orientation becomes lower than the resistivity in other orientations.

This invention utilizes materials that exhibit crystallographic anisotropy of the size effect to mitigate the resistivity increase, which is useful for reducing signal delay along interconnect wires in semiconductor devices. In one embodiment of the present invention, the nanowires are fabricated from tungsten (W).

DETAILED DESCRIPTION OF THE INVENTION

Figure 1A:
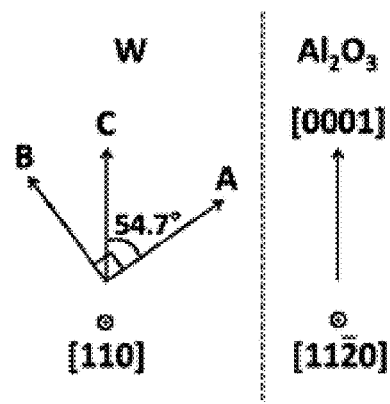
FIG. 1A shows a schematic top view of crystallographic orientations for the epitaxial (110)-W film (on the left) and the (11$\bar{2}$0)-Al$_2$O$_3$ substrate (on the right).

This disclosure describes methods for the fabrication and use of oriented crystal interconnects for semiconductors in which the crystals are oriented to exhibit anisotropic scattering processes whereby line resistivity in one crystallographic orientation becomes lower than the resistivity in other orientations.

This invention utilizes materials that exhibit crystallographic anisotropy of the size effect to mitigate the resistivity increase, which is useful for reducing signal delay along interconnect wires in semiconductor devices. The corresponding nanowire interconnect structures are also described. In one embodiment of the present invention, the nanowires are fabricated from tungsten (W).

The resistivity size effect is typically attributed to the momentum loss of carriers along the axis of the conductors due to surface scattering (evidenced by the film-thickness/line-width dependence of resistivity) and grain boundary scattering (evidenced by the grain size dependence of resistivity). According to the FS and MS models, which are discussed in more detail in "Surface and grain boundary scattering in nanometric Cu films," by Sun, B. Yao, A. P. Warren, K. Barmak, M. F. Toney, R. E. Peale, and K. R. Coffey, Phys. Rev. B Vol. 81, 155454 (2010), an effective method to mitigate the resistivity size effect is to introduce a material having a short electron mean free path. Tungsten is a promising candidate in this regard since its electron mean free path of 19.1 nm (averaged over the Fermi surface) is approximately two times smaller than that for Cu.

However, an additional reduction of the size effect severity can be achieved by considering the anisotropy of conduction in the crystal or crystals that make up the interconnect wire.

This anisotropy, as suggested by the complex shape of the Fermi surface in W, compared with the nearly free-electron-like Fermi surface for Cu, gives rise to anisotropic scattering processes such that line resistivity in one crystallographic orientation (relative to the direction of the electric current) becomes lower than the resistivity in other orientations.

The anisotropy of the resistivity size effect in metallic wires was demonstrated in one embodiment by using single crystal W lines with their longitudinal directions (i.e., the direction of electric current flow) coinciding with the <100>, <110> and <111> orientations of the body centered cubic (bcc) W. A reduction in incremental resistivity of more than a factor of two was observed at the line-width of ~15 nm for the <111> orientation compared with other orientations. By contrast, polycrystalline W lines consisting of crystals having a random mixture of crystallographic orientations in the longitudinal direction (the electric current direction) of the wire (serving as control samples) did not exhibit anisotropy.

This result, which is not limited to just W, clearly indicates the importance of crystallographic orientation in nanoscale metallic conduction (and therefore current flow and signal delay in electronic devices). Accordingly, oriented-crystal wires can be used in electronic devices to minimize the resistivity size effects and thereby reduce signal delays. Other materials that are expected to display an anisotropy of the resistivity size effect are metals having a complex Fermi surface (see for example http://www.phys.ufl.edu/fermisurface/, which illustrates Fermi surfaces from the spherical surfaces of potassium (K) and rubidium (Rb) to the moderately complex surfaces of some of the group 11 and group 13 metals and the highly complex surfaces of groups 2-10 and 12). These include the hexagonal close packed (hcp) crystal structure metals, such as beryllium (Be), magnesium (Mg), scandium (Sc), titanium (Ti), yttrium (Y), zirconium (Zr), hafnium (Hf), technetium (Tc), rhenium (Re), osmium (Os), ruthenium (Ru) and cobalt (Co); the face centered cubic (fcc) crystal structure metals, such as aluminum (Al), nickel (Ni), rhodium (Rh), palladium (Pd), iridium (Ir), and platinum (Pt); as well as the other bcc metals, such as vanadium (V), chromium (Cr), iron (Fe), manganese (Mn), niobium (Nb), and molybdenum (Mo). Intermetallic compounds, such as the silicides, and aluminides, having non-spherical Fermi surfaces are also expected to display an anisotropy of the resistivity size effect.

It should be noted, however, that other criteria than the size effect are important to the suitability of a metal to serve as an oriented crystal nanowire for a semiconductor interconnect and not all the above listed metals will be suitable, due to reasons of cost, chemical stability, or difficulty of integration into the semiconductor manufacturing process.

In an exemplar embodiment, a (110)-epitaxial W film and a polycrystalline W film were deposited on sapphire ($Al_2O_3$) and silicon (Si), respectively, at 520° C. by DC magnetron sputtering using a 99.95% pure W target. The substrate for the epitaxial film was ($11\bar{2}0$)-$Al_2O_3$, whereas a thermally oxidized (100)Si substrate was used for the polycrystalline film. Sputtering power was fixed at 250 W. The deposition rate at this power was 1.4 Å/sec. Following deposition, the films were annealed at 850° C. for two hours in Ar+4% $H_2$ ambient.

The polycrystalline W film was found to be weakly <110> fiber-textured (normal to film plane) by an X-ray ψ-scan, i.e., where the sample was tilted about an axis in the scattering plane, perpendicular to the scattering vector. The mean in-plane grain size of the polycrystalline film was obtained from 1058 grains by conical dark-field TEM imaging of plan-view samples. The in-plane crystallographic orientations of the crystals of this polycrystalline W film were known to be random due to the deposition of this film onto an amorphous $SiO_2$ surface. Additional details of film deposition and characterization by X-ray diffraction and transmission electron microscopy (TEM) were performed by methods known to those skilled in the art, including "Phase, grain structure, stress, and resistivity of sputter-deposited tungsten films" by D. Choi, B. Wang, S. Chung, X. Liu, A. Darbal, A. Wise, N. T. Nuhfer, K. Barmak, A. P. Warren, K. R. Coffey, M. F. Toney, J. Vac. Sci. Tech. A, Vol. 29, 051512 (2011) and "Electron Mean Free Path of Tungsten and the Electrical Resistivity of Epitaxial (110) Tungsten Films" by D. Choi, C. S. Kim, D. Naveh, S. Chung, A. P. Warren, N. T. Nuhfer, M. F. Toney, K. R. Coffey and K. Barmak, Phys. Rev. B, Vol. 86, 045432 (2012), which are incorporated herein by reference. Film thicknesses were measured by X-ray reflectivity. Film resistivities were measured using the van der Pauw method. Table I lists the crystal orientation, thickness and the resistivity of the single crystal and polycrystalline (random crystal) W films. The table also gives the grain size for the polycrystalline film.

TABLE I

Film type, film normal orientation, thickness, resistivity, and grain size are given.

| Type | Orientation | Thickness (nm) | Resistivity (μΩ-cm) | Grain size (nm) |
|---|---|---|---|---|
| Epitaxial | (110) | 21.2 | 9.3 | — |
| Polycrystalline | weak <110> fiber-texture | 20.5 | 11.3 | 133 ± 6 |

Figure 1B:
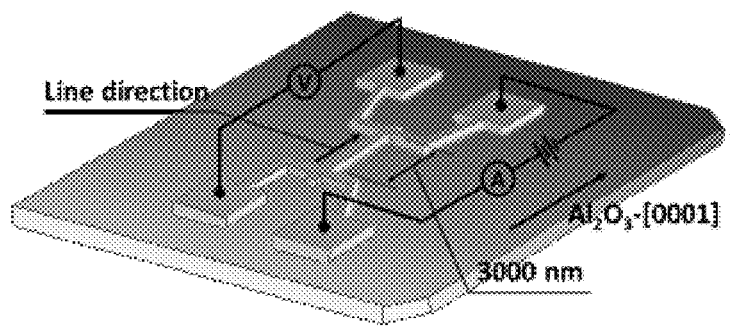
FIG. 1B shows a schematic of a patterned structure with the electrical measurement set-up.
Figure 1C:
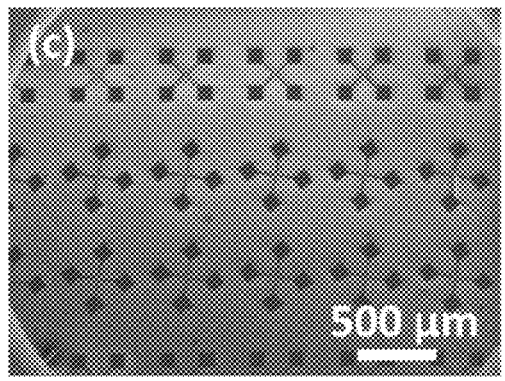
FIG. 1C shows a low-magnification scanning electron microscope (SEM) image that shows the patterned structure of FIG. 1B with the three line directions. The W lines in the first, second and third horizontal rows from the top respectively correspond to the C, B and A directions shown in FIG. 1A.
Figure 1D:
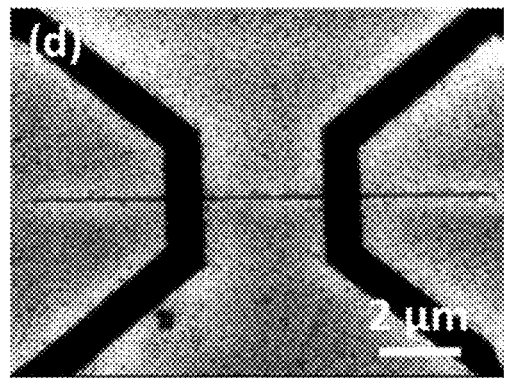
FIG. 1D shows a high-magnification SEM image that shows a single W line.

Single crystal W lines with the longitudinal directions in the <100>, <110> and <111> orientations of bcc W were formed by subtractively patterning the epitaxial W film with reactive ion etching (RIE) using a mixture of $SF_6$, $CHF_3$ and $O_2$. FIG. 1A shows a schematic top view of crystallographic orientations for the epitaxial (110)-W film (on the left) and the ($11\bar{2}0$)-$Al_2O_3$ substrate (on the right). Directions of A, B and C correspond to the [001], [110] and [111] orientations of bcc-W (See Table II). A combination of electron beam and optical lithography was used to generate the initial test structure pattern. A combination of patterned electron beam resist (hydrogen silsesquioxane) and photoresist (AZ4110) was used as etch masks for pattern transfer. Line-widths were in the range of 14.8-451.3 nm and are given in Table II. The line lengths were 3 μm. To provide comparison samples, lines were formed on the polycrystalline W film by applying identical fabrication conditions, including the angular distribution of the three line directions. Line resistance was measured at 298 K and 150 K by the four point contact method, schematically shown in FIG. 1B. The line direction in this particular schematic corresponds to the C orientation. Line width and line resistivity were determined using the temperature coefficient of resistance (TCR) method. Scanning electron microscopy (SEM) images of the patterned structures are given in FIGS. 1C and 1D.

Figure 2A:
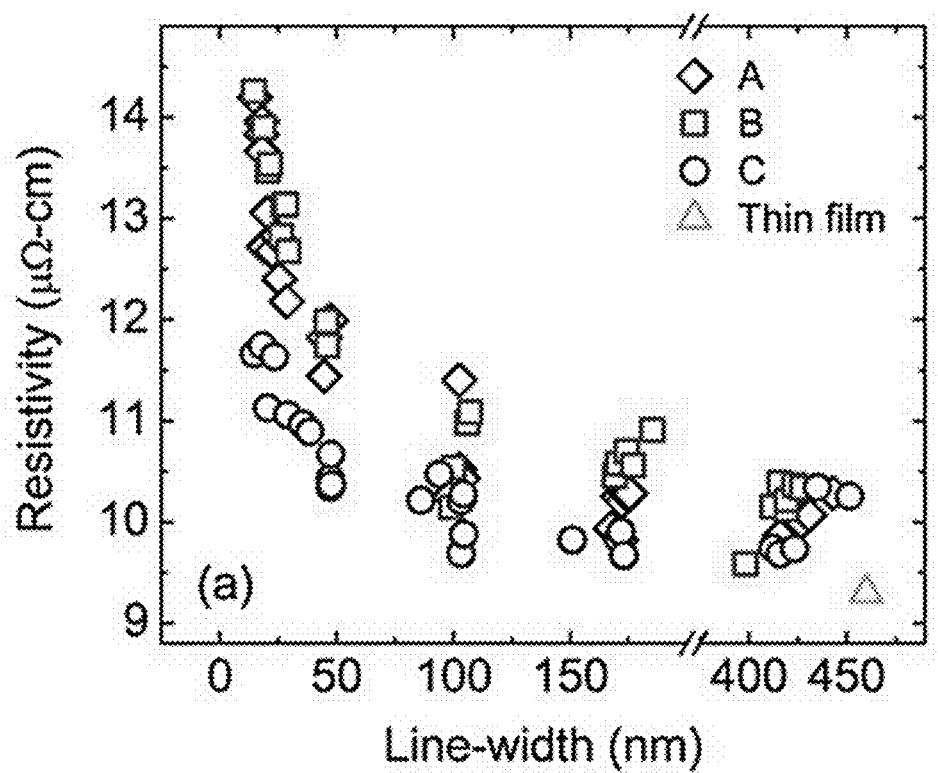
FIG. 2A shows data on resistivity as a function of linewidth for the single crystal W lines in the A, B and C orientations. The thin film resistivity prior to patterning is also plotted.
Figure 2B:
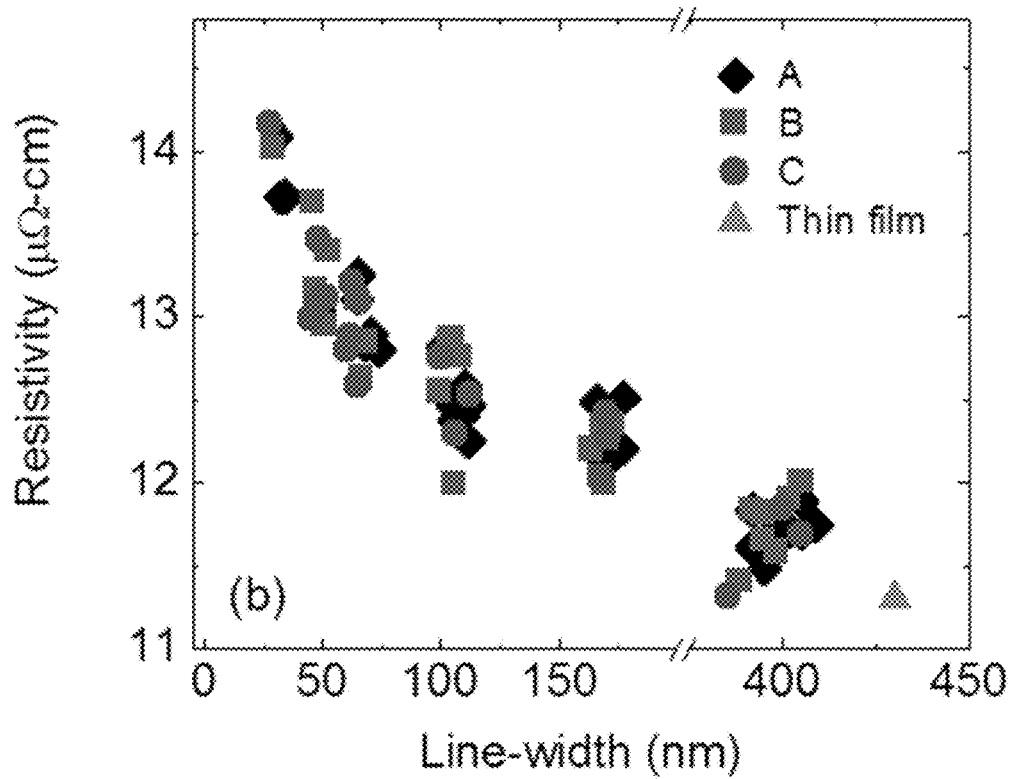
FIG. 2B shows data on resistivity as a function of linewidth for the polycrystalline lines having random in plane crystallographic orientations. Here the A, B and C designations refer to the mask pattern orientations as used to fabricate the oriented single crystal wires shown in FIG. 2A. The thin film resistivity prior to patterning is also plotted.

FIG. 2A plots line resistivities at 298 K as a function of line-width for the single crystal W lines having line directions, and hence electric current directions, parallel to the <100>, <110> and <111> crystallographic orientations of the bcc W metallic film. The resistivities are in the range of 9.6 to 14.3 μΩ-cm. A clear anisotropy was observed for line-widths below 50 nm, with the smallest size effect in the <111> direction (FIG. 2A). The anisotropy of the resistivity becomes less pronounced with increasing line-width and eventually disappears as the line resistivity approaches the film resistivity. By contrast, the polycrystalline lines (control samples) do not exhibit anisotropy in the measured resistivity associated with the fabrication of the lines, as shown in FIG. 2B. Line resistivities for both the single crystal W and polycrystalline W lines at 150 K show a similar trend. Table II summarizes the line-widths and resistivities for the narrowest and widest lines for the three orientations of the single crystal W lines and for the polycrystalline lines. It is worth noting that the resistivities of 9.6 and 11.4 μΩ-cm, obtained for the widest single crystal and polycrystalline W lines, are close to the corresponding blanket thin film resistivities of 9.3 and 11.3 μΩ-cm, respectively.

TABLE II

Line direction identification, corresponding crystallographic line directions in bcc W, narrowest line-widths and line resistivities, and widest line-widths and line resistivities are given. The line-length is fixed at 3 μm for all the lines.

| Line i.d. | Line direction | Narrowest line-width (nm) | Line resistivity (μΩ-cm) | Widest line-width (nm) | Line resistivity (μΩ-cm) |
|---|---|---|---|---|---|
| A | <100> | 15.0 | 14.2 | 442.9 | 9.8 |
| B | <110> | 14.6 | 14.3 | 427.0 | 9.6 |
| C | <111> | 14.8 | 11.7 | 451.3 | 9.7 |
| A, B, C | Random Mixture | 27.3 | 14.2 | 408.9 | 11.4 |

The Fermi surface of W is composed of four closed parts, namely, the hole octahedron, hole ellipsoid, electron jack and electron ball. The complex shape of the Fermi surface reflects a significant anisotropy associated with the conduction electrons in W. This anisotropy is most pronounced for the Fermi velocity for the hole octahedron, with values of 5.3, 9.5 and $15.5 \times 10^6$ ms$^{-1}$ in the <100>, <110> and <111> orientations, respectively. By contrast, a significantly lower anisotropy is associated with the other three parts of the Fermi surface. Table III summarizes reported values of the area fractions, ranges of the Fermi velocity, and anisotropy (defined as the ratio of maximum to minimum Fermi velocity) for the four components of the Fermi surface.

TABLE III

Parts comprising the Fermi surface of W, their surface area fractions, Fermi velocity and anisotropy are given. Anisotropy is defined as the ratio of maximum to minimum Fermi velocity.

| Parts | Surface area (%) | Fermi velocity ($10^5$ m/sec) | Anisotropy |
|---|---|---|---|
| Hole octahedron | 33 | 5.3-15.5 | 2.9 |
| Hole ellipsoid | 12 | 5.7-6.2 | 1.1 |
| Electron jack | 55 | 7.5-9.2 | 1.2 |
| Electron ball | | 4.2-6.7 | 1.6 |

Since the dominant scattering mechanism in the nanoscale single crystal films and lines of interest can be surface scattering and the size effect is a result of the scattering of electrons from these surfaces. One possible explanation for the observed anisotropic size effect in W lines is related to the non-symmetric distribution of electron momentum (or velocity). The hole octahedron, with its pronounced anisotropy of Fermi velocity (factor of 2.9 compared to 1.1-1.6 for the other three parts of the Fermi surface) and its relatively large share of the Fermi surface (33%), may therefore be expected to play the dominant role in the anisotropy of the size effect.

Figure 3:
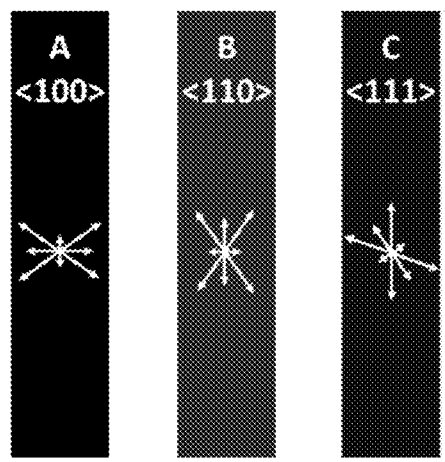
FIG. 3 shows schematic illustrations of the single crystal lines fabricated to have the current direction parallel to the <100>, <110> and <111> crystallographic directions in the W single crystal film. The arrows represent the Fermi velocities for the hole octahedron in the <100>, <110> and <111> orientations. The arrows are drawn following the vector system (i.e., the directions and lengths of the arrows represent the orientations and magnitudes of the Fermi velocity).

FIG. 3 gives a two-dimensional geometric relation between the orientation of the single crystal lines identified in FIG. 1A and the Fermi velocities (following the vector notation) for the hole octahedron in these orientations.

If it is presumed that W exhibits a single (isotropic) electron scattering relaxation time, the Fermi velocity distribution given in FIG. 3 can be also considered to be the relative distribution of the electron mean free path in the different crystal directions. Based on this, the observed resistivity size effect in W lines might be explained by focusing on the largest (and most influential) Fermi velocity relative to the sidewalls of the lines. For the lines in the <100> and <110> orientations, the two largest components of the Fermi velocity are directed at the surfaces at 54.7° and 35.3° with respect to the line directions. When the electrons with these Fermi velocities experience surface scattering, the loss of electron momentum along the line axis, i.e., the cosine contribution, is relatively large, giving rise to a steep resistivity size effect. By contrast, the lines in the <111> orientation have their two largest Fermi velocity components at 0° and 70.5° with respect to the line direction. The former component, being parallel with the line surfaces (e.g., in the wire's longitudinal direction), is not expected to be affected by surface scattering, and the cosine contribution of the latter component is relatively small when compared with the <100> and <110>-oriented lines. This geometric argument gives a possible simple description for the significantly weaker size effect for the lines in the <111> orientation. For the polycrystalline lines where there are some 23 grains with random in-plane orientations along the lines (estimated as line length of 3 μm divided by mean grain size of 133 nm given in Table I), the anisotropy is expected to be averaged out, which is in agreement with FIG. 2B.

Figure 4:
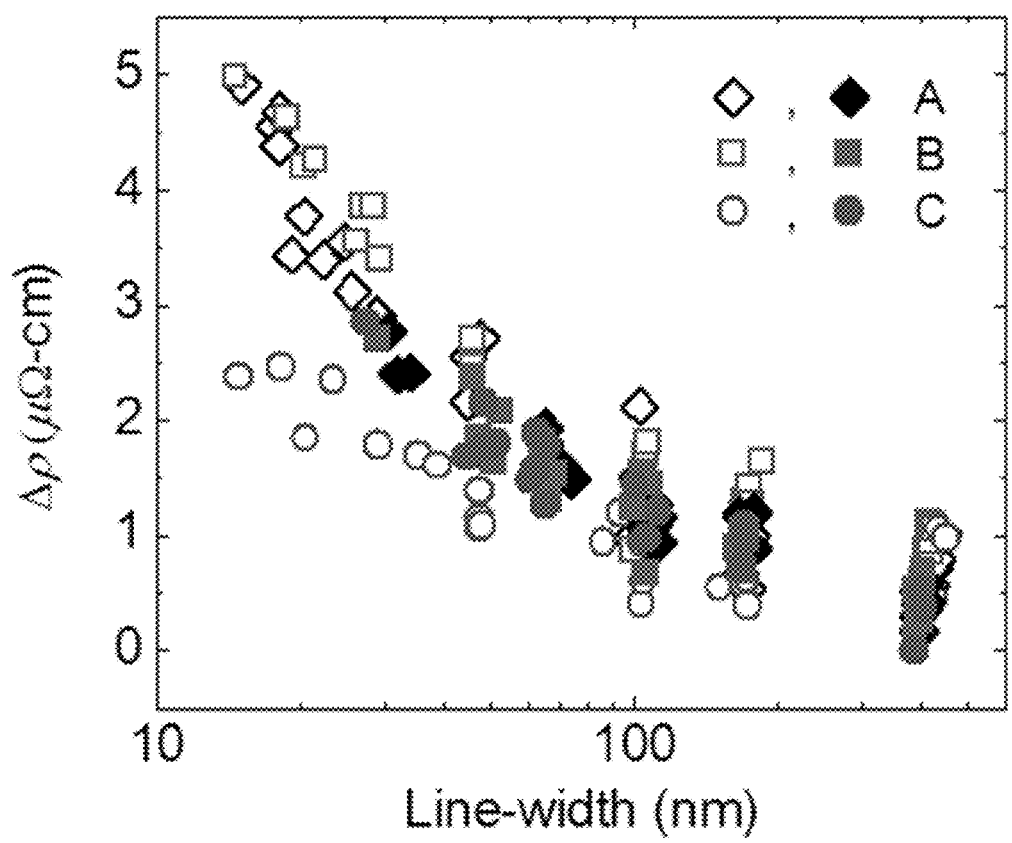
FIG. 4 shows data on the increase in resistivity with respect to the thin film resistivity plotted as a function of line-width for the single crystal (open symbols) and polycrystalline (closed symbols) lines for the three directions given in Table II.

The increase in resistivities for the oriented crystal lines and polycrystalline lines (with random in-plane crystalline orientations) relative to the thin film resistivities are plotted together in FIG. 4 as a function of line-width. They show an increase of 2.4 μΩ-cm for the 14.8 nm-wide <111> oriented line as compared with an increase of 4.9 and 5.0 μΩ-cm for the 15.0 nm wide <100> and 14.6 nm wide <110> oriented lines, respectively. For the polycrystalline lines, the incremental increase in resistivity at the line-width of 29.1 nm is 2.7 μΩ-cm, as compared with 1.8 μΩ-cm for the <111> oriented crystal lines at a nearly similar line-width of 29.0 nm. Furthermore, FIG. 4 implies that the contribution of surface scattering to the resistivity size effect for the polycrystalline lines (with random in-plane crystalline orientations) is higher than the smallest (i.e., the <111>-lines) but lower than the largest (i.e., the <110>-lines) resistivity size effect seen in the single crystal W lines.

In conclusion, an anisotropic resistivity size effect was demonstrated in single crystal body centered cubic tungsten lines with their longitudinal directions in the <100>, <110> and <111> crystallographic directions. The lines in the <111> orientation exhibited the smallest size effect for line-widths down to ~15 nm, indicating that this is the preferred crystal orientation of nanoscale semiconductor interconnect wires.

In the semiconductor manufacturing process, the oriented crystal W nanowires would be formed using the familiar techniques of epitaxial growth upon suitable substrates and/or seed layers or underlayers. In W, the anisotropy of the size effect is attributed to the geometric relations between the line directions and the anisotropic Fermi velocity for the hole octahedron, which leads to anisotropic momentum loss along the line axis of the single crystal lines. Thus, oriented crystal or crystals (as opposed to randomly oriented crystals) can mitigate the resistivity size effect in interconnects for electronic devices.

The present invention was described primarily in an embodiment using tungsten nanowires of particular configurations. Nevertheless, it will be understood that various materials that exhibit anisotropy may be used, and various configurations and processing methods could be used without departing from the spirit and scope of the invention. Accordingly, other embodiments are within the scope of the invention. Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described.

The following references are incorporated herein by reference: J. J. Thompson, Proc. Cambridge Philos. Soc. 11, 120 (1901); K. Fuchs, Proc. Cambridge Philos. Soc. 34, 100 (1938); E. H. Sondheimer, Adv. Phys. 1, 1 (1952); A. F. Mayadas and M. Shatzkes, Phys. Rev. B, 1, 1382 (1970); http://www.itrs.net/Links/2011ITRS/2011Chapters/2011Interconnect.pdf; D. Josell, S. H. Brongersma and Z. Tökei, Annu Rev. Mater. Res. 39, 231 (2009); T. Sun, B. Yao, A. P. Warren, K. Barmak, M. F. Toney, R. E. Peale, and K. R. Coffey, Phys. Rev. B 81, 155454 (2010); D. Choi, B. Wang, S. Chung, X. Liu, A. Darbal, A. Wise, N. T. Nuhfer and K. Barmak, A. P. Warren, K. R. Coffey, M. F. Toney, J. Vac. Sci. Tech. A 051512 (2011); D. Choi, C. S. Kim, D. N. S. Chung, A. P. Warren, N. T. Nuhfer, M. F. Toney, K. R. Coffey and K. Barmak, Phys. Rev. B 045432 (2012); D. J. Dingley, Microchim. Acta 155, 19 (2006); L. J. Van der Pauw, Philps Res. Rep. 13, 1 (1958); W. Steinhögl, G. Schindler, G. Steinlesberger, M. Traving and M. Engelhardt, J. Appl. Phys. 97, 023706 (2005); L. F. Mattheiss, Phys. Rev. 139, A 1893 (1965); J. Kollár, Solid State Comm. 27, 1313 (1978); P. J. Feenan, A. Myers and D. Sang, Solid State Communication 16, 35 (1975); 16. J. M. Ziman, Phys. Rev. 121, 1320 (1961); K. Barmak, T. Sun and K. R. Coffey, Proceedings of Stress-induced Phenomena in Metallization: 11th International Workshop. Bad Schandau, Germany, 1300, 12 Apr., 2011 (AIP, Park, College Park, 2011); and R. F. Girvan, A. V. Gold and R. A. Phillips, 29, 1485, J. Phys. Chem. Solids (1968).

We claim:

1. A semiconductor device comprising:
    at least one interconnect wire having a length greater than a width or a height, the width and the height being sufficiently small so as to result in an increase in an electrical resistivity of the wire,
    wherein the at least one interconnect wire has a crystallographic orientation of its crystal or crystals relative to a direction of current flow that minimizes the increase in the electrical resistivity due to the width and the height.

2. The semiconductor device of claim 1, wherein the at least one interconnect wire comprises tungsten.

3. The semiconductor device of claim 1, wherein the at least one interconnect wire comprises <111> tungsten.

4. The semiconductor device of claim 1, wherein the at least one interconnect wire comprises a single crystal nanowire.

5. The semiconductor device of claim 1, wherein the at least one interconnect wire comprises at least two single crystal nanowires.

6. A wire having a length greater than a width or a height, the width and the height being sufficiently small so as to result in an increase in an electrical resistivity of the wire,
    wherein the wire has a crystallographic orientation of its crystal or crystals relative to a direction of current flow that minimizes the increase in the electrical resistivity due to the width and the height.

7. The wire of claim 6, wherein the wire comprises metal.

8. The wire of claim 7, wherein the metal comprises a hexagonal close packed crystal structure metal.

9. The wire of claim 7, wherein the metal comprises a body centered cubic crystal structure metal.

10. The wire of claim 7, wherein the metal comprises a face centered cubic crystal structure metal.

11. The wire of claim 7, wherein the metal comprises a Fermi surface that is not spherical.

12. The wire of claim 6, wherein the wire comprises a single crystal metal material.

13. The wire of claim 6, wherein the wire comprises tungsten.

14. The wire of claim 6, wherein the wire comprises single crystal tungsten.

15. The wire of claim 6, wherein the wire comprises single crystal tungsten with a <111> crystallographic orientation.

16. The wire of claim 6, wherein the wire comprises a crystal rotated about a <111> axis.

17. The wire of claim 6, wherein the wire comprises an intermetallic compound.

18. The wire of claim 6, wherein the wire does not consist of a polycrystalline randomly oriented crystal material.

19. A method for reducing signal delay along interconnect wires in semiconductor devices, comprising:
    providing an interconnect wire formed of a material with a crystallographic orientation relative to a direction of current flow that minimizes an increase in an electrical resistivity due to a width and height of the interconnect wire.

20. The method of claim 19, wherein the crystallographic orientation is selected according to a distribution of Fermi velocity of the material.

21. The method of claim 19, wherein the material is tungsten with the crystallographic orientation of <111>.

22. The method of claim 19, wherein providing the interconnect wire comprises:
    performing an anisotropic etching process on a thin film of the material to form the interconnect wire with the crystallographic orientation.

* * * * *

UNITED STATES PATENT AND TRADEMARK OFFICE
CERTIFICATE OF CORRECTION

| | | |
|---|---|---|
| PATENT NO. | : 9,117,821 B2 | Page 1 of 1 |
| APPLICATION NO. | : 14/204050 | |
| DATED | : August 25, 2015 | |
| INVENTOR(S) | : Barmak Vaziri et al. | |

It is certified that error appears in the above-identified patent and that said Letters Patent is hereby corrected as shown below:

On the title page, Col. 2, line 3, delete "D0I:" and insert -- DOI: --

Signed and Sealed this
Twelfth Day of January, 2016

Michelle K. Lee
*Director of the United States Patent and Trademark Office*